US008294136B2

(12) United States Patent
Totani et al.

(10) Patent No.: US 8,294,136 B2
(45) Date of Patent: Oct. 23, 2012

(54) NITRIDE-BASED SEMICONDUCTOR LIGHT EMITTING ELEMENT

(75) Inventors: Shingo Totani, Aichi-ken (JP); Yukitaka Hasegawa, Aichi-ken (JP)

(73) Assignee: Toyoda Gosei Co., Ltd., Aichi-Ken (JP)

( * ) Notice: Subject to any disclaimer, the term of this patent is extended or adjusted under 35 U.S.C. 154(b) by 153 days.

(21) Appl. No.: 12/382,676

(22) Filed: Mar. 20, 2009

(65) Prior Publication Data

US 2009/0250683 A1  Oct. 8, 2009

(30) Foreign Application Priority Data

Mar. 24, 2008  (JP) .............................. 2008-075354

(51) Int. Cl.
*H01L 33/00* (2010.01)

(52) U.S. Cl. .................. 257/13; 257/103; 257/E33.023; 257/E33.008

(58) Field of Classification Search ...................... 257/13
See application file for complete search history.

(56) References Cited

U.S. PATENT DOCUMENTS

| 2004/0086717 | A1* | 5/2004 | Sasaki et al. ............... 428/411.1 |
| 2004/0104399 | A1* | 6/2004 | Ou et al. ....................... 257/102 |
| 2004/0232454 | A1* | 11/2004 | Uemura et al. .............. 257/222 |
| 2006/0054907 | A1* | 3/2006 | Lai .................................. 257/96 |
| 2007/0170596 | A1* | 7/2007 | Wen et al. ..................... 257/777 |
| 2008/0152879 | A1* | 6/2008 | Nashiki et al. ............... 428/212 |
| 2009/0127548 | A1 | 5/2009 | Inoue et al. |

FOREIGN PATENT DOCUMENTS

| JP | 9-176837 A | 7/1997 |
| JP | 2002-313141 A | 10/2002 |
| JP | 2006-279005 | 10/2006 |
| KR | UM-20-0376685 | 3/2005 |
| WO | WO 2007/046181 A1 | 4/2007 |

OTHER PUBLICATIONS

Korean Office Action dated Jul. 7, 2010, with English translation.
Notification for Reasons for Refusal dated Feb. 14, 2012 with English-language translation.

* cited by examiner

*Primary Examiner* — Zandra Smith
*Assistant Examiner* — Lawrence Tynes, Jr.
(74) *Attorney, Agent, or Firm* — McGinn IP Law Group, PLLC

(57) ABSTRACT

The purpose of the present invention is to obtain a nitride-based semiconductor light emitting element capable of improving light emission efficiency by reducing sheet resistance and a forward voltage of a translucent electrode including indium cerium oxide. The nitride-based semiconductor light emitting element of the present invention is has a translucent electrode including indium cerium oxide; and cerium oxide is contained in a ratio of 10 to 20 wt % with respect to a whole of the indium cerium oxide.

13 Claims, 4 Drawing Sheets

NITRIDE-BASED SEMICONDUCTOR LIGHT EMITTING ELEMENT

BACKGROUND

This invention relates to a nitride-based semiconductor light emitting element using a translucent electrode as an electrode of a nitride-based semiconductor represented by $In_XAl_YGa_{1-X-Y}N$ ($0 \leq X$, $0 \leq Y$, $X+Y<1$).

There are two types of light emitting element as a light emitting element having a nitride-based semiconductor layer on an insulate growth substrate such as sapphire ($Al_2O_3$) substrate: the one is a face-up type light emitting element which is mounted on a mounting part of a printed substrate at the sapphire substrate side, and the other one is a face-down type light emitting element which is mounted on a mounting part of a printed substrate at the nitride-based semiconductor side. In the former one, as the light extracting surface of the main light emitting element is upper-surface of the nitride-based semiconductor side, the electrode formed on the top have to be a translucent electrode.

In general, the face-up light emitting element that uses ITO (Indium-Tin-Oxide) as a translucent electrode is well known.

The nitride-based semiconductor has a high refractive index of about 2.5. Therefore, in the case of using the nitride semiconductor as the light emitting element, it is required to improve light extraction efficiency of the light emitting element by increasing a critical angle of an interface by reducing a refractive index difference between the translucent electrode and the nitride-based semiconductor.

Since ITO has a refractive index of 1.8 to 1.9, a translucent electrode having a higher refractive index is in demand. As one example the translucent electrode, the use of ICO (Indium-Cerium-Oxide) having a refractive index of 2.0 to 2.1 is considered (see JP-A-2006-279005, for example).

However, ICO has large sheet resistance and a high forward voltage (VF) due to its unsatisfactory current diffusion property. Due to such properties, there has been a problem of poor light emission efficiency of the light emitting element.

SUMMARY

This invention has been accomplished in view of the above-described problems, and an object thereof is to provide a nitride-based semiconductor light emitting element capable of improving light emission efficiency by way of reductions in sheet resistance and forward voltage of a translucent electrode made from ICO.

The above-described problems are solved by a nitride-based semiconductor light emitting element including a translucent electrode, which includes indium cerium oxide, and cerium oxide is contained in a ratio of 10 to 20 wt % with respect to a whole of the indium cerium oxide.

The translucent electrode may preferably be used as a p-electrode.

The translucent electrode may preferably be used as a p-electrode and an n-electrode.

A film thickness of the translucent electrode may preferably be 100 to 1000 nm.

The inventors have found that sheet resistance and a forward voltage are reduced when cerium oxide is contained in a ratio of 10 to 20 wt % with respect to a whole of indium cerium oxide. Therefore, it is possible to obtain a nitride-based semiconductor light emitting element capable of emitting light emission efficiency with the use of indium cerium oxide having the above-specified composition.

PREFERRED EMBODIMENTS

The inventors conducted the following experiments in order to reduce the sheet resistance of ICO.

A mixture of indium oxide ($In_2O_3$) and cerium oxide ($CeO_2$) in which indium oxide is contained in an amount of 10 wt % is prepared as a target. Subsequently, a sapphire substrate is placed in an electron beam vapor deposition apparatus, and a pressure and a temperature inside the device were kept at 0.01 Pa or less and 350° C. Next, under each of 5 types of oxygen introduction conditions from 0.015 to 0.1 Pa, an ICO film having a thickness of 200 nm is formed on a surface of the sapphire substrate by employing an electron beam vapor deposition method. Also, as to each of the 5 kinds of ICO films, sheet resistance after a calcination treatment under a pressure of 15 Pa or less and at a temperature of 700° C. for 5 minutes and sheet resistance without the calcination treatment are measured. Results of the experiment are shown in Table 1.

TABLE 1

| | | Oxygen Pressure during ICO Formation [Pa] | | | | |
|---|---|---|---|---|---|---|
| | | 0.015 | 0.03 | 0.045 | 0.06 | 0.1 |
| Sheet Resistance ($\Omega/\square$) | With Calcination | 16 | 18 | 20 | 18 | 21 |
| | Without Calcination | 20 | 19 | 40 | 24 | 82 |

From Table 1, it is apparent that the sheet resistance of the ICO film is reduced in those on which the calcination treatment is performed irrespective of the oxygen introduction conditions. Also, it is revealed that it is possible to obtain the ICO film having stably low sheet resistance under the oxygen introduction of 0.03 Pa or less with or without calcination.

It is possible to produce a light emitting element having high light emission efficiency by using as the electrode the ICO film that is improved in current diffusion property as described above.

Further, the inventors conducted the following experiments on influences to be exerted by a composition of the ICO film on sheet resistance and a forward voltage.

First Embodiment

Shown in FIGS. 1A, 1B, 1C, 1D and 1E are sectional views showing a production method for a light emitting element according to a first embodiment of this invention.

Figure 1A:
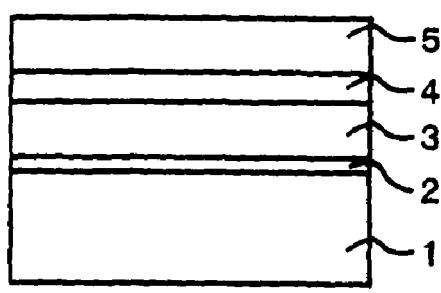
FIGS. 1A, 1B, 1C, 1D, and 1E are sectional views showing a production method for a nitride-based semiconductor light emitting element according to the first embodiment of this invention.

To start with, formation of a nitride-based compound layer shown in FIG. 1A will be described.

A sapphire substrate 1 cleaned by organic cleaning and a heat treatment is inserted into a susceptor placed in a reaction chamber of a MOCVD device. Subsequently, a sapphire ($Al_2O_3$) substrate 10 is baked at 1100° C. with $H_2$ (hydrogen) being supplied to the reaction chamber at a flow rate of 2 L/min at an ordinary pressure for about 30 minutes.

Subsequently, a buffer layer having a thickness of about 15 nm and made from AlN is formed by lowering the temperature to 400° C. and supplying $H_2$ at 20 L/min, $NH_3$ (ammonium) at 10 L/min, and TMA (trimethyl aluminum) at $1.8\times10^{-5}$ mol/min for about one minute.

After the formation of the buffer layer 2, an n-type contact layer having a film thickness of about 4.0 μm and made from n-type GaN having an electron concentration of $2\times10^{18}/cm^3$ and a Si (silicon) concentration of $4\times10^{18}/cm^3$ is formed by raising the temperature to 1150° C. and supplying $H_2$ at 20 L/min, $NH_3$ at 10 L/min, TMG (trimethyl gallium) at $1.7\times10^4$ mol/min, and silane ($SiH_4$) diluted to 0.86 ppm with $H_2$ at $20\times10^{-8}$ mol/min for about 40 minutes. After that, an n-type clad layer formed of a multilayer of laminated layers of 10 pairs of undoped $In_{0.1}Ga_{0.9}N$, undoped GaN, and Si-doped GaN (one pair consists of undoped $In_{0.1}Ga_{0.9}N$, undoped GaN, and Si-doped GaN) is formed by: maintaining the temperature to 800° C.; supplying $N_2$ or $H_2$ at 10 L/min and $NH_3$ at 10 L/min; and switching the supply amounts of TMG, TMI, and silane diluted to 0.86 ppm with an $H_2$ gas. The n-type contact layer and the n-type clad layer were used as an n-type layer 3.

After the formation of the n-type layer 3, a light emitting layer 4 of a multi-quantum well structure (MQW) in which 8 pairs of a well layer formed of $In_{0.2}Ga_{0.8}N$ having a film thickness of about 3 nm and a barrier layer formed of GaN having a film thickness of about 2 nm and $Al_{0.06}Ga_{0.94}N$ having a film thickness of about 3 nm are alternately stacked (one pair consist of the well layer and the barrier layer) is formed by: maintaining the temperature to 770° C. and switching the supply amounts of TMG, TMI, and TMA.

After the formation of the light emitting layer 4, a p-type clad layer having a film thickness of about 33 nm and formed of a multilayer of p-type $Al_{0.3}Ga_{0.7}N$ and a p-type $In_{0.08}Ga_{0.92}N$ is formed by: maintaining the temperature to 840° C.; supplying $N_2$ or $H_2$ at 10 L/min and $NH_3$ at L/min; and switching the supply amounts of TMG, TMI, TMA, and $Cp_2Mg$ (cyclopentadienyl magnesium). Subsequently, a p-type contact layer formed of two GaN layers having different Mg (magnesium) concentrations of $5\times10^{19}/cm^3$ and $1\times10^{20}/cm^3$ by: maintaining the temperature to 1000° C.; supplying $N_2$ or $H_2$ at 20 L/min and $NH_3$ at 10 L/min; and switching the supply amounts of TMG and $Cp_2Mg$. The p-type contact layer and the p-type clad layer were used as a p-type layer 5.

After forming the nitride-based compound semiconductor layer as described above, a predetermined region of a surface of the n-type contact layer is exposed by performing reactive ion etching with a gas containing chlorine to parts of the p-type layer 5 and the light emission layer 4 that were not covered with a mask and a part of the n-type clad layer and the n-type contact layer of the n-type layer 3 by using a photoresist having a window formed at a predetermined region as the mask.

Figure 1B:
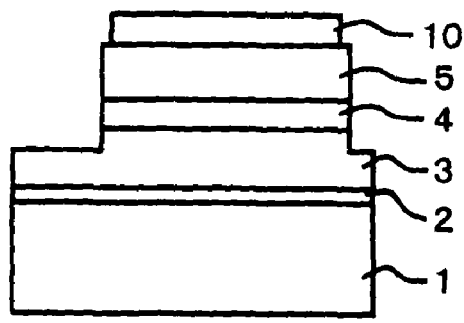

The nitride-semiconductor after exposing the n-type contact layer is placed in an electron beam vapor deposition device provided with 6 types of targets that are mixtures of cerium oxide and indium oxide and varied by contents of cerium oxide from 5 to 30 wt %, and a pressure and a temperature inside the device were maintained to 0.01 Pa or less and 350° C. Subsequently, after forming an ICO film having a film thickness of 250 nm on an entire part of the exposed surface of the nitride semiconductor by electron beam vapor deposition in relation to each of the targets by introducing oxygen of 0.03 Pa, a calcination treatment of a treatment time of 5 minutes and a temperature of 700° C. is performed. Wet etching is performed in such a manner that the ICO film remains only on an upper surface of the p-type layer 5 as shown in FIG. 1B by using a photoresist having a window formed at a predetermined region as a mask, and the remaining ICO film is used as a p-electrode 10. After that, the photoresist is eliminated.

Figure 1C:
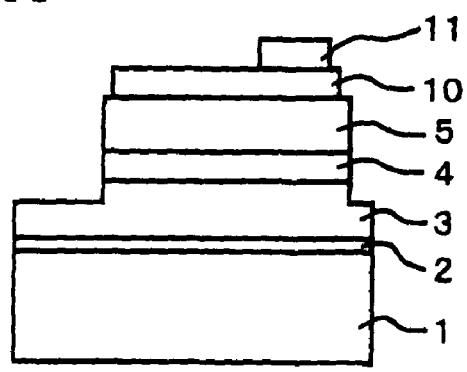

After the formation of p-electrode 10, a p-pad electrode is formed by laminating Ni (nickel; film thickness: 40 nm)/Au (gold; film thickness: 1500 nm) on a part of an upper surface of the p-electrode by vacuum vapor deposition by using a photoresist having a window formed at a predetermined region as a mask as shown in FIG. 1C and then removing the photoresist by lift-off.

Figure 1D:
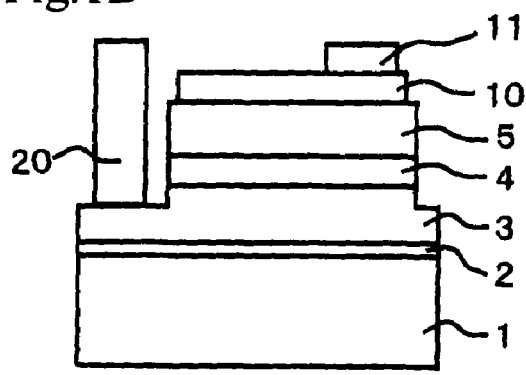

After the formation of the p-electrode, an n-electrode 20 is formed by laminating V (vanadium; film thickness: 17.5 nm)/Al (aluminum; film thickness: 2020 nm) on a part of an upper surface of the exposed n-type contact layer by using a photoresist having a window formed at a predetermined region as a mask as shown in FIG. 1D and then removing the photoresist by lift-off.

After the formation of the n-electrode 20, alloying of the n-type electrode 20 to the n-type contact layer and a reduction in resistance of p-type layer 5 were performed by a heat treatment under an atmosphere containing nitrogen, at a temperature of 600° C., and a treatment time of 5 minutes.

Figure 1E:
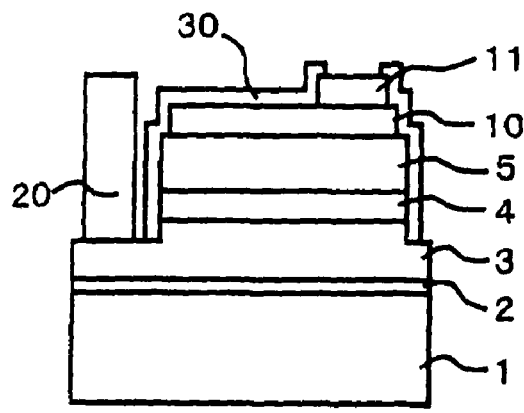

Lastly, as shown in FIG. 1E after forming a protection film 30 made from $SiO_2$ (silicon oxide) on an entire surface on a nitride semiconductor side by CVD using TEOS (tetraethylorthosilicate), an upper surface of the p-pad electrode and the n-electrode were exposed from the protection layer 30 by wet etching by using a photoresist having a window formed at a predetermined region as a mask.

Properties of the plurality of types of nitride semiconductor light emitting elements formed by the above-described steps and having p-electrodes that were varied in composition were measured.

Figure 3:
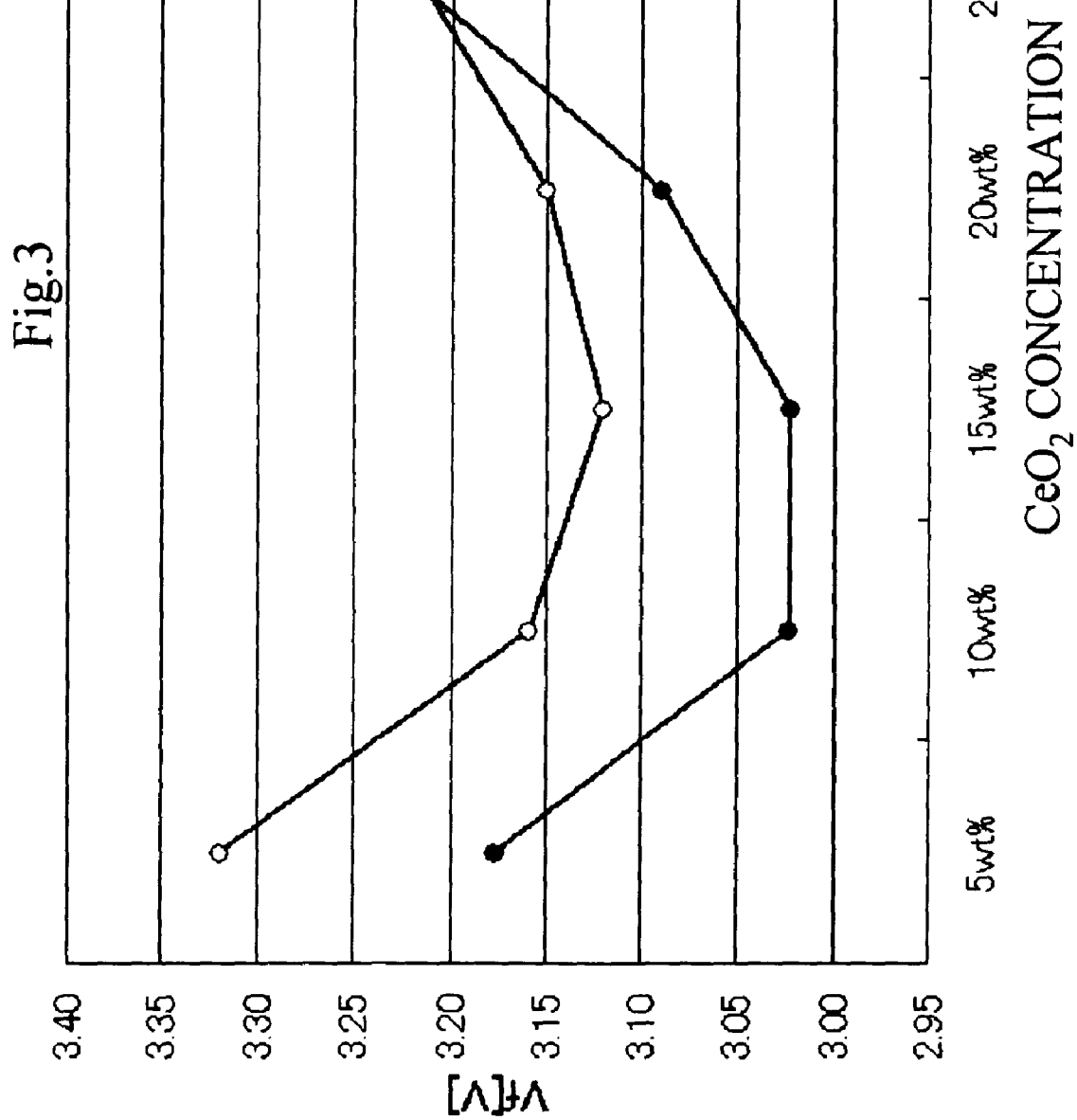
FIG. 3 is a graph showing measurement results of a forward voltage (voltage when a forward current is 20 mA) and sheet resistance in relation to a composition of an ICO film.

FIG. 3 is a graph showing measurement results of a forward voltage (voltage when a forward current is 20 mA) and sheet resistance in relation to the composition of the ICO film.

Referring to FIG. 3, the forward voltage is remarkably low when the content of cerium oxide is 10 to 20 wt % as compared to the forward voltages when the cerium oxide content is higher or lower than 10 to 20 wt %. Such tendency is observed with the sheet resistance, too.

Figure 4:
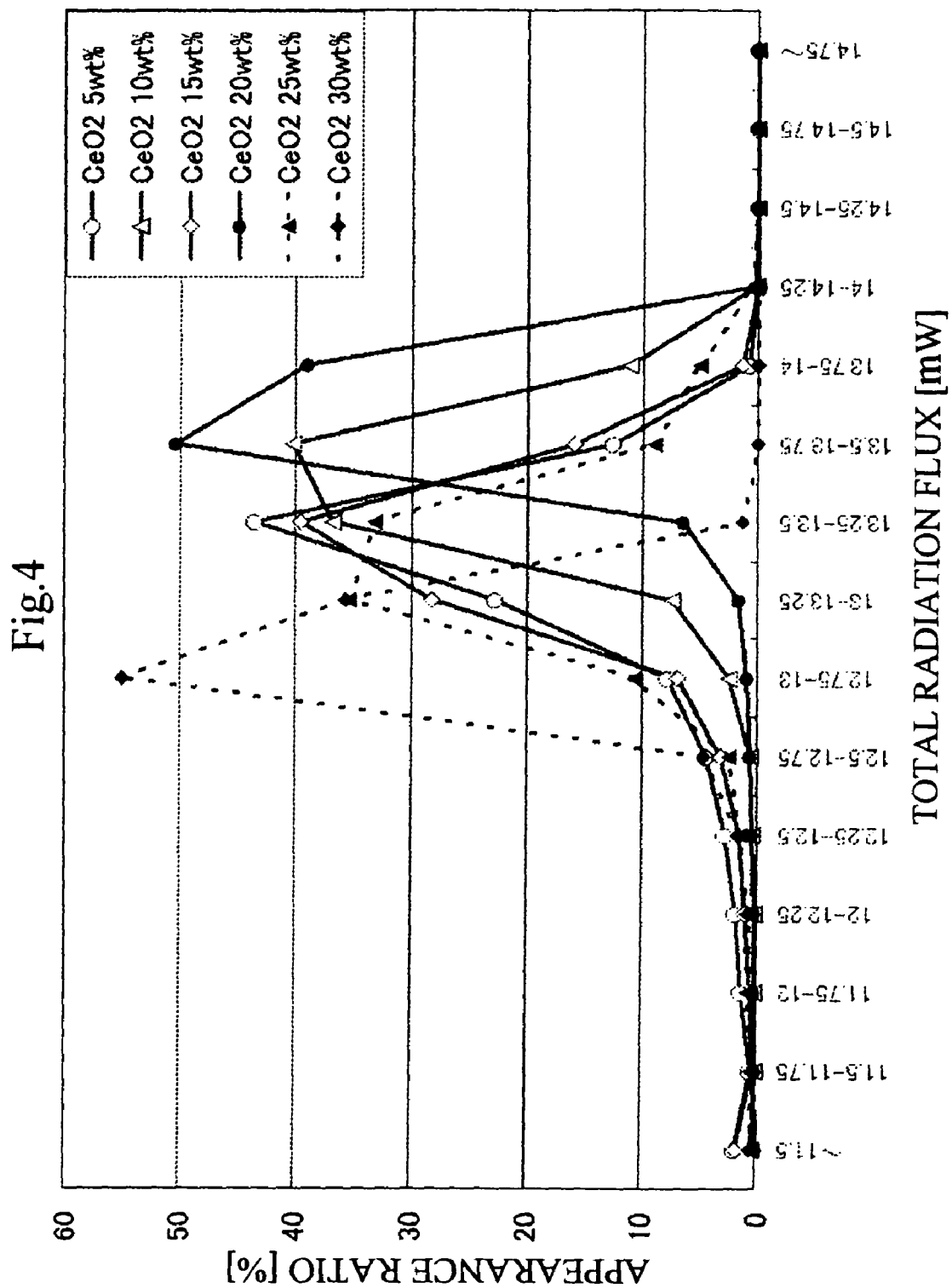
FIG. 4 is a graph showing an appearance ratio of total radiation flux of emitted light of the light emitting element in relation to a composition of an ICO film.

FIG. 4 is a graph showing an appearance ratio of total radiation flux of emitted light of the light emitting element in relation to the composition of the ICO film.

Referring to FIG. 4, it is apparent that there is a tendency that the total radiation flux is reduced when the content of cerium oxide is 25 wt % or more.

From the graphs of FIG. 3 and FIG. 4, it is revealed that it is optimum to contain 10 to 20 wt % of cerium oxide as the composition of the ICO film in the case of using the ICO film as the p-electrode.

Contact resistance of the ICO film to the p-type layer by the above-described production method is confirmed to be $0.006\Omega\cdot cm^2$ which achieves good ohmic contact.

Second Embodiment

Shown in FIGS. 2A, 2B, 2C, and 2D are sectional views showing a production method for a light emitting element according to a second embodiment of this invention.

Figure 2A:
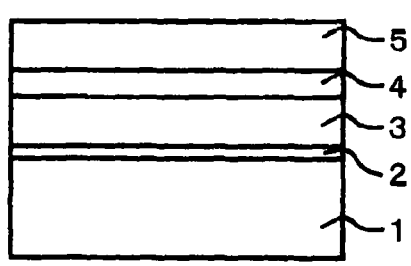
FIGS. 2A, 2B, 2C, and 2D are sectional views showing a production method for a nitride-based semiconductor light emitting element according to the second embodiment of this invention.

The second embodiment is different from the first embodiment in the method of forming the p-electrode, p-electrode pad, and n-electrode. Since FIG. 2A is the same as that of the first embodiment, detailed description thereof will be omitted.

Figure 2B:
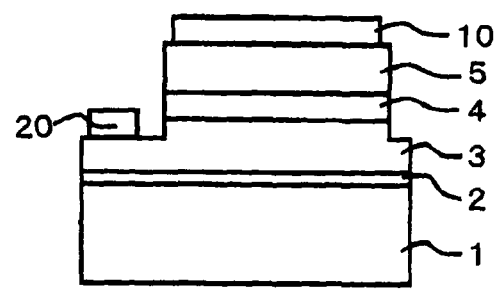

This embodiment is characterized by the feature of simultaneously forming a p-electrode, a p-electrode pad, and an n-electrode. A buffer layer 2, an n-type layer 3, a light emitting layer 4, and a p-type layer were formed on a sapphire substrate 1 in this order from a side of the sapphire substrate 1 as shown in FIG. 2A, and a predetermined region of a surface of the n-type layer 3 is exposed as shown in FIG. 2B. After that, a target that is a mixture of cerium oxide and indium oxide wherein cerium oxide is 5 to 30 wt % is prepared, and an ICO film is formed on an entire part of an exposed surface of a nitride semiconductor by electron beam vapor deposition, followed by a calcination treatment. Subsequently, wet etching is performed in such a manner that the ICO film remains only on the p-type layer 5 and an upper surface of the n-type layer by using a photoresist having a window formed at a predetermined region as a mask, and the remaining ICO film is used as a p-electrode 10 and an n-electrode lower layer 20a. After that, the photoresist is eliminated.

Figure 2C:
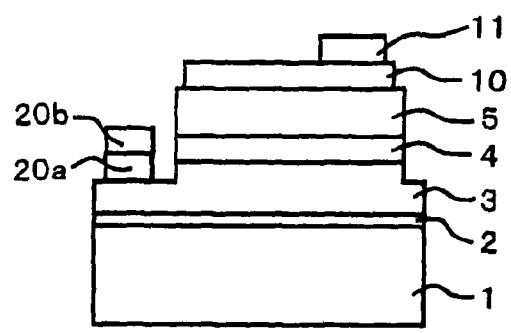
Figure 2D:
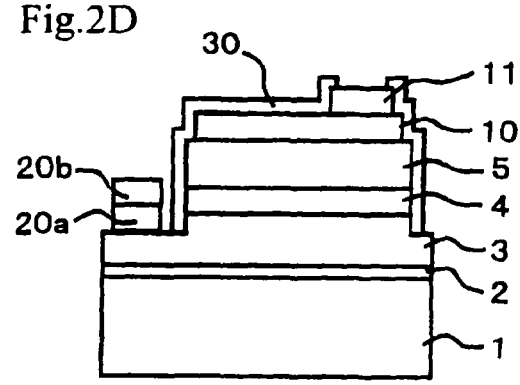

Subsequently, after laminating Ni/Au by vacuum vapor deposition on a part of an upper surface of the p-electrode 10 and an upper surface of the n-electrode by using a photoresist having a window formed at a predetermined region as a mask as shown in FIG. 2C, the photoresist is eliminated by lift-off to form a p-pad electrode 11 and n-electrode upper layer 20b.

In short, in this embodiment, the electrode of the n-electrode is identical to the p-electrode and the p-pad electrode in material, film thickness, and lamination structure.

In this embodiment that employs the above-described production method, since the production steps are simplified, it is possible to produce nitride-based semiconductor light emitting element at a lower cost.

Other Embodiments

This invention is not limited to the above-described embodiments.

Though the formation of the ICO film is performed after exposing the n-type contact layer in the foregoing embodiments, it is possible to expose the n-type contact layer after the formation of the ICO film. Also, though the ICO film is formed by employing the electron beam vapor deposition, the ICO film may be formed by ion plating or sputtering.

The film thickness of the ICO film may preferably be 100 to 1000 nm. Electric resistance of the ICO film is increased to cause an increase in forward voltage when the ICO film is thinner than 100 nm, and light absorption of the ICO film and emission of nitride-based semiconductor light emitting element become non-uniform to reduce light extraction efficiency when the ICO film is thicker than 1000 nm.

The ICO film may preferably be formed under an atmosphere of oxygen introduction of 0.01 Pa or more. When the oxygen introduction is less than 0.01 Pa, the crystal structure of the ICO film is altered to reduce a carrier density and mobility, resulting in increase in sheet resistance of the ICO film.

A calcination atmosphere for the ICO film may preferably be a nitrogen atmosphere or a vacuum atmosphere of 15 Pa or less. Calcination under an atmosphere of an oxygen content of a certain degree or more causes loss of oxygen holes serving as carriers due to oxygen and increases the sheet resistance. A calcination condition for the ICO film may preferably be 300° C. to 800° C. The crystal structure of the ICO film is not stabilized to fail to achieve the effect of reducing the sheet resistance with the calcination at less than 300° C., and the nitride-based semiconductor layer can be damaged with the calcination at more than 800° C.

The lowermost layer of the p-pad electrode contacting the p-electrode may be a metal other than Ni (nickel) used in the foregoing embodiments insofar as the metal can be brought into ohmic contact with the p-electrode. Examples of the metal include Ti (titanium), Cr (chromium), Rh (rhodium), and Al (aluminum).

The lowermost layer of the n electrode contacting the n-type contact layer may be a metal other than V (vanadium) used in the foregoing embodiments insofar as the metal can be brought into ohmic contact with the n-type contact layer. Examples of the metal include Ni (nickel), Ti (titanium), and W (tungsten).

As the uppermost layer of the p-pad electrode and the uppermost layer of the n-electrode, Au (gold), an Au alloy, Al (aluminum), or an aluminum alloy may preferably be used since they have excellent bonding properties.

Though $SiO_2$ (silicon oxide; refractive index: 1.45) is used as the protection layer in the foregoing embodiments, $SiN_x$ (silicon nitride; refractive index: 1.8 to 2.0) may also be used. For example, in the case where the nitride-based semiconductor light emitting element is sealed with a resin, it is possible to further improve light extraction efficiency since the refractive index gradually changes along the light extraction path of the nitride-based semiconductor (refractive index: 2.5), ICO (refractive index: 2.0 to 2.1), $SiN_x$ (refractive index: 1.8 to 2.0), and the resin (refractive index: 1.4 to 1.5).

Though the sapphire substrate is used as the growth substrate of the nitride-based semiconductor layer in the foregoing embodiments, a crystal substrate made from spinel ($MgAl_2O_4$), gallium nitride (GaN), silicon carbonate (SiC), gallium oxide ($Ga_2O_3$), and the like may be used in place of the sapphire substrate.

It is possible to use the ICO film of this invention as an electrode of various modes of nitride-based semiconductor light emitting elements. For example, it is possible to use the ICO film of this invention as an electrode on a nitride semiconductor side for a nitride-based semiconductor element having an electrode on each of a substrate reverse surface and a nitride semiconductor upper surface.

Examples of such nitride-based semiconductor light emitting element include the one obtainable by: forming a nitride-based semiconductor layer on a growth substrata; forming a p-electrode by using a high reflectivity metal such as Ag (silver), an Ag alloy, or the like on a surface of a p-type contact layer; contacting with a support substrate made from a metal such as CU and a p-type silicon single crystal via AuSn (gold/tin) soldering; eliminating the growth substrate by irradiating an interface between the growth substrate and the nitride semiconductor layer with a laser; and forming an n-electrode on an exposed surface of an n-type layer.

What is claimed is:

1. A nitride-based semiconductor light emitting element comprising:
   a p-doped nitride-based semiconductor layer; and
   a translucent electrode,
   wherein the translucent electrode comprises calcined indium cerium oxide,
   wherein the indium cerium oxide includes cerium oxide in a ratio of 10 wt % to 20 wt % with respect to a whole of the indium cerium oxide, and
   wherein the indium cerium oxide is brought into ohmic contact with the p-doped nitride-based semiconductor layer.

2. The nitride-based semiconductor light emitting element according to claim 1, wherein the translucent electrode comprises a p-electrode and an n-electrode.

3. The nitride-based semiconductor light emitting element according to claim 1, wherein the translucent electrode comprises a film thickness of 100 to 1000 nm.

4. The nitride-based semiconductor light emitting element according to claim 1, wherein the indium cerium oxide comprises a mixture of indium oxide and the cerium oxide.

5. The nitride-based semiconductor light emitting element according to claim 1, wherein the indium cerium oxide consists of a mixture of indium oxide and the cerium oxide.

6. A nitride-based semiconductor light emitting element comprising:
   a base-substrate;
   a buffer-layer formed on the base substrate;
   an n-doped nitride-based semiconductor layer formed on the buffer-layer;
   a light emitting layer comprising a multi-quantum-well structure formed on the n-doped nitride-based semiconductor layer;
   a p-doped nitride-based semiconductor layer formed on the light emitting layer;
   a translucent electrode comprising indium cerium oxide in which the indium cerium oxide includes cerium oxide in a ratio of 10 wt % to 20 wt % with respect to a whole of the indium cerium oxide, and formed on the p-doped nitride-base semiconductor layer and the n-doped nitride base semiconductor layer;
   a p-electrode pad formed on the translucent electrode including a bottom layer contacting to the translucent electrode and a top layer formed on the bottom layer; and
   a n-electrode formed on the translucent electrode including a bottom layer contacting the translucent electrode and a top layer formed on the bottom layer,
   wherein the iridium cerium oxide directly contacts the p-doped nitride-based semiconductor layer.

7. The nitride-based semiconductor light emitting element according to claim 6, wherein the translucent electrode comprises a film thickness of 100 to 1000 nm.

8. The nitride-based semiconductor light emitting element according to claim 6, wherein the bottom layer of the p-electrode pad comprises from at least one of nickel, titanium, chromium, rhodium, and aluminum.

9. The nitride-based semiconductor light emitting element according to claim 6, wherein the bottom layer of the n-electrode comprises at least one of vanadium, nickel, titanium, and tungsten.

10. The nitride-based semiconductor light emitting element according to claim 6, wherein the top layer of the p-electrode pad and the top layer of the n-electrode comprises at least one of gold, gold alloy, aluminum, and aluminum alloy.

11. The nitride-based semiconductor light emitting element according to claim 6, wherein the substrate comprises at least one of sapphire, spinel, gallium nitride, silicon carbide, and gallium oxide.

12. The nitride-based semiconductor light emitting element according to claim 6, wherein the indium cerium oxide comprises a mixture of indium oxide and the cerium oxide.

13. The nitride-based semiconductor light emitting element according to claim 6, wherein the indium cerium oxide consists of a mixture of indium oxide and the cerium oxide.

* * * * *